US009881983B2

(12) United States Patent
Her et al.

(10) Patent No.: US 9,881,983 B2
(45) Date of Patent: Jan. 30, 2018

(54) ORGANIC LIGHT-EMITTING DIODE DISPLAY

(71) Applicant: Samsung Display Co., Ltd., Yongin-si, Gyeonggi-do (KR)

(72) Inventors: Yong-Koo Her, Yongin-si (KR); Chong Chul Chai, Seoul (KR); Ji Hye Lee, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 45 days.

(21) Appl. No.: 15/141,678

(22) Filed: Apr. 28, 2016

(65) Prior Publication Data
US 2016/0322443 A1    Nov. 3, 2016

(30) Foreign Application Priority Data

Apr. 29, 2015  (KR) .................. 10-2015-0060661

(51) Int. Cl.
*G09G 5/00* (2006.01)
*H01L 27/32* (2006.01)
*G09G 3/3258* (2016.01)
*H01L 29/786* (2006.01)
*G09G 3/3233* (2016.01)

(52) U.S. Cl.
CPC ....... *H01L 27/3262* (2013.01); *G09G 3/3233* (2013.01); *G09G 3/3258* (2013.01); *H01L 29/78645* (2013.01); *G09G 2300/043* (2013.01); *G09G 2300/0819* (2013.01); *G09G 2300/0842* (2013.01); *G09G 2300/0861* (2013.01);

(Continued)

(58) Field of Classification Search
USPC ......... 345/76, 82, 90, 92, 95, 211, 209, 204, 345/690, 698; 257/E27.111
See application file for complete search history.

(56) References Cited

U.S. PATENT DOCUMENTS 7,184,006 B2 * 2/2007 Kim ....................... G09G 3/325
257/E27.111
9,013,457 B2 * 4/2015 Kimura ............... H01L 33/0041
345/204

(Continued)

FOREIGN PATENT DOCUMENTS

KR    10-0570995 B1    4/2006
KR    10-1034679 B1    5/2011
KR    10-1056233 B1    8/2011

*Primary Examiner* — Thuy Pardo
(74) *Attorney, Agent, or Firm* — Knobbe Martens Olson & Bear LLP

(57) ABSTRACT

An OLED display is disclosed. A plurality of signal lines are formed over a substrate, and a plurality of pixels are formed over the substrate in a matrix form and electrically connected to corresponding signal lines. The signal lines include a plurality of scan lines configured to transmit a scan signal, a plurality of initialization lines configured to transmit an initialization signal, and a plurality of data lines configured to transmit a data signal. An n-th row pixel includes a switching thin film transistor (TFT) electrically connected to an n-th row scan line and a corresponding data line among the data lines. A driving TFT is electrically connected to a drain of the switching TFT, an OLED is electrically connected to a drain of the driving TFT, and an initialization TFT is configured to be turned on based on an initialization signal transmitted via an n-th row initialization line.

14 Claims, 5 Drawing Sheets

(52) U.S. Cl.
CPC ............ *G09G 2310/0262* (2013.01); *G09G 2310/061* (2013.01); *H01L 27/3276* (2013.01)

(56) References Cited

U.S. PATENT DOCUMENTS

| | | | | |
|---|---|---|---|---|
| 2005/0243039 | A1* | 11/2005 | Kwak | G09G 3/3233 345/76 |
| 2007/0200805 | A1* | 8/2007 | Sato | G09G 3/3233 345/76 |
| 2008/0088543 | A1* | 4/2008 | Shibusawa | G09G 3/325 345/76 |
| 2012/0127146 | A1* | 5/2012 | Sato | G09G 3/3233 345/211 |
| 2013/0321248 | A1* | 12/2013 | Kimura | H01L 33/0041 345/76 |
| 2014/0111404 | A1* | 4/2014 | Omata | H05B 33/08 345/76 |
| 2014/0111557 | A1* | 4/2014 | Omata | G09G 3/3233 345/690 |
| 2014/0159609 | A1 | 6/2014 | Xie | |
| 2016/0019855 | A1* | 1/2016 | Liu | G09G 3/3648 345/204 |

* cited by examiner

US 9,881,983 B2

ORGANIC LIGHT-EMITTING DIODE DISPLAY

CROSS-REFERENCE TO RELATED APPLICATION

This application claims priority to and the benefit of Korean Patent Application No. 10-2015-0060661 filed on Apr. 29, 2015, the entire contents of which are incorporated herein by reference.

BACKGROUND

Field

The described technology generally relates to an organic light-emitting diode display.

Description of the Related Technology

An organic light-emitting diode (OLED) has a matrix of pixels, each one of which has luminance that can be controlled by controlling a current or voltage applied to the OLED. Since OLED displays are suitable for use in high contrast and rapid response devices, they have been used in mobile devices, smartphones, laptop computers, digital broadcasting terminals, personal digital assistants (PDAs), portable multimedia players (PMPs), navigations, slate computers, tablet computers, ultrabooks, wearable devices, digital TVs, desktop computers, digital signage, and the like.

An OLED display includes scan lines, data lines, power lines, and pixel circuits connected to the scan, data, and power lines. Each pixel circuit typically includes an OLED, transistors including a switching transistor transmitting a data signal and a driving transistor driving the OLED according to the data signal, and a capacitor maintaining a data voltage of the data signal.

As the resolution of display devices increases, the display device is built with pixels integrated in a narrow display area. In this case, since each pixel occupies a limited area, a predetermined area is defined for thin film transistors and capacitors formed to drive OLED luminance appropriately for the input data to be displayed.

The above information disclosed in this Background section is only to enhance the understanding of the background of the described technology and therefore it may contain information that does not constitute the prior art that is already known in this country to a person of ordinary skill in the art.

SUMMARY OF CERTAIN INVENTIVE ASPECTS

One inventive aspect relates to provide an OLED display in which an area of elements included in a pixel can be ensured.

Another aspect is an OLED display including: a substrate, a plurality of signal lines formed on the substrate, and a plurality of pixels formed on the substrate in a matrix form and connected to corresponding signal lines among the plurality of signal lines, wherein the signal lines may include a plurality of scan lines formed on the substrate and transmitting a scan signal, a plurality of initialization lines formed on the substrate and transmitting an initialization signal, and a plurality of data lines crossing the scan line and transmitting a data signal, wherein an n-th row pixel may include a switching thin film transistor connected to an n-th row scan line and a corresponding data line among the plurality of data lines, a driving thin film transistor connected to a drain of the switching thin film transistor, an OLED connected to a drain of the driving thin film transistor, an initialization thin film transistor turned on by an initialization signal transmitted through an n-th row initialization line to apply an initialization voltage to a gate of the driving transistor, and a reset thin film transistor turned on by the initialization signal transmitted through an n+1-th row initialization line to apply the initialization voltage to an anode of the OLED, and wherein the n+1-th row initialization line may overlap a second semiconductor area formed in a second direction between a first semiconductor area and a third semiconductor area formed in a first direction.

The n+1-th row initialization line may include a gate of the reset thin film transistor included in the n-th row pixel and a gate of the initialization thin film transistor included in an n+1-th row pixel.

The reset thin film transistor included in the n-th row pixel and the initialization thin film transistor included in the n+1-th row pixel may include the first semiconductor area, the second semiconductor area, and the third semiconductor area.

Each of the first semiconductor area, the second semiconductor area, and the third semiconductor area may be substantially formed to have a U-shape.

The first semiconductor area may be connected to the anode of the OLED and an initialization voltage line supplying the initialization voltage, through the contact hole.

The second semiconductor area may partially overlap the n+1-th row initialization line.

Another aspect is an organic light-emitting diode (OLED) display, comprising: a substrate; a plurality of signal lines formed over the substrate; and a plurality of pixels formed over the substrate in a matrix form and electrically connected to corresponding signal lines among the signal lines. The signal lines include: a plurality of scan lines formed over the substrate and configured to transmit a scan signal; a plurality of initialization lines formed over the substrate and configured to transmit an initialization signal; and a plurality of data lines crossing the scan lines and configured to transmit a data signal. An n-th row pixel includes: a switching thin film transistor (TFT) electrically connected to an n-th row scan line and a corresponding data line among the data lines; a driving TFT electrically connected to a drain of the switching TFT; an OLED electrically connected to a drain of the driving TFT; an initialization TFT configured to be turned on based on an initialization signal transmitted via an n-th row initialization line so as to apply an initialization voltage to a gate of the driving TFT, wherein the substrate includes first to third semiconductor areas located in the n-th row, wherein an (n+1)-th row initialization line overlaps the second semiconductor area in the depth dimension of the OLED display, wherein the first and third semiconductor areas extend in a first direction, and wherein the second semiconductor area extends in a second direction crossing the first direction.

The above OLED display, the n-th row pixel further includes a reset TFT configured to be turned on based on the initialization signal transmitted via the n+1-th row initialization line so as to apply the initialization voltage to the OLED.

In the above OLED display, the (n+1)-th row initialization line includes a gate electrode of the reset TFT included in the n-th row pixel and a gate electrode of the initialization TFT included in an (n+1)-th row pixel.

In the above OLED display, the reset TFT included in the n-th row pixel and the initialization TFT included in the (n+1)-th row pixel include the first to third semiconductor areas.

In the above OLED display, each of the first to third semiconductor areas has a substantially U-shape.

In the above OLED display, the first semiconductor area is electrically connected to an anode electrode of the OLED and an initialization voltage line configured to supply the initialization voltage via the contact hole.

In the above OLED display, the second semiconductor area partially overlaps the (n+1)-th row initialization line.

In the above OLED display, the first to third semiconductor areas are integrally formed.

In the above OLED display, the first to third semiconductor areas are formed on the same layer.

In the above OLED display, the width of the first semiconductor area measured in the first direction is substantially the same as the width of the third semiconductor area measured in the first direction.

In the above OLED display, the width of the first semiconductor area measured in the first direction is substantially the same as the width of the second semiconductor area measured in the second direction.

In the above OLED display, the width of the first and third semiconductor areas measured in the first direction and the width of the second semiconductor area measured in the second direction are greater than the width of the (n+1) initialization line.

In the above OLED display, the initialization TFT includes a double-gate transistor configured to prevent current leakage and includes two gate electrodes connected to the (n+1) initialization line.

Another aspect is an organic light-emitting diode (OLED) display, comprising: a substrate; a plurality of pixels formed over the substrate in a matrix form, wherein the pixels include an n-th row of pixels and an (n+1)-th row of pixels, and wherein the n-th row of pixels includes first to third semiconductor areas; and a plurality of initialization lines formed over the substrate and configured to transmit an initialization signal to the pixels, wherein each of the n-th and (n+1)-th rows includes a reset transistor, wherein the initialization line of the (n+1)-th row is electrically connected to a gate electrode of the reset transistor of the n-th row, wherein the (n+1)-th row initialization line overlaps the second semiconductor area in the depth dimension of the OLED display, wherein the first and third semiconductor areas extend in a first direction, and wherein the second semiconductor area extends in a second direction crossing the first direction.

The above OLED display further comprises an initialization transistor in the n-th and (n+1)-th rows and having a double-gate structure, wherein the initialization transistor includes two gate electrodes electrically connected to the corresponding initialization line.

In the above OLED display, the first to third semiconductor areas are formed on the same layer.

In the above OLED display, the first to third semiconductor areas have substantially the same thickness.

In the above OLED display, the width of the first semiconductor area measured in the first direction is substantially the same as the width of the third semiconductor area measured in the first direction.

In the above OLED display, at least a portion of the second semiconductor area is placed between the first and third semiconductor areas.

In the above OLED display, the first and second directions are substantially perpendicular to each other.

According to at least one of the disclosed embodiments, display quality may be improved and the capacity of a storage capacitor may be secured.

DETAILED DESCRIPTION OF CERTAIN INVENTIVE EMBODIMENTS

Figure 1:
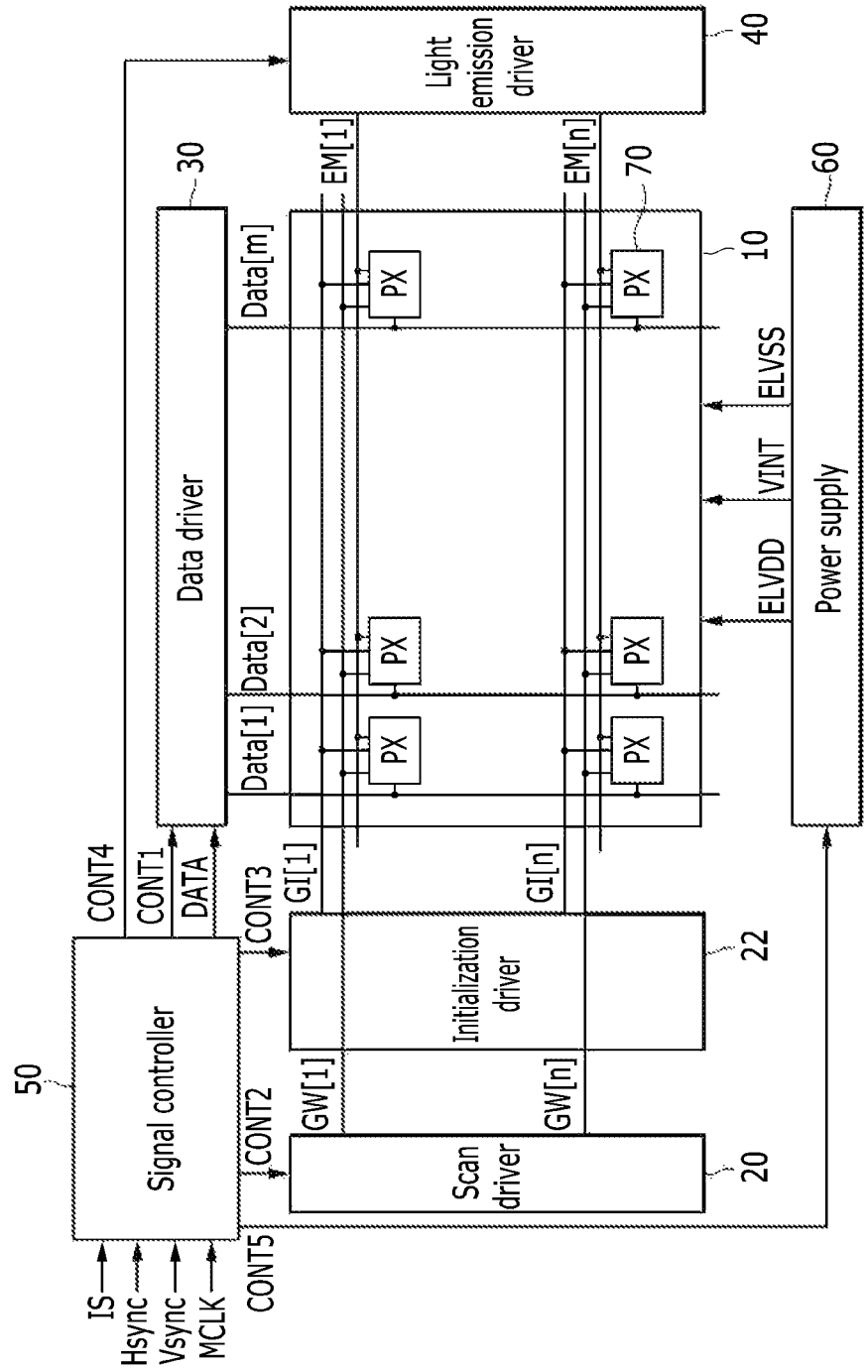
FIG. 1 is a block diagram illustrating an OLED display according to an example embodiment.

Hereinafter, exemplary embodiments disclosed in the present specification will be described in detail with reference to the accompanying drawings. In the present specification, the same or similar components will be denoted by the same or similar reference numerals, and duplicate descriptions thereof will be omitted. The terms "module" and "unit" for components used in the following description are used only in order to make the specification more clear. Therefore, these terms do not have meanings or roles that distinguish them from each other by themselves. In describing exemplary embodiments of the present specification, when it is determined that a detailed description of the well-known art associated with the described technology may obscure the gist of the described technology, it will be omitted. The accompanying drawings are provided only in order to allow exemplary embodiments disclosed in the present specification to be easily understood and are not to be interpreted as limiting the spirit disclosed in the present specification, and it is to be understood that the described technology includes all modifications, equivalents, and substitutions without departing from the scope and spirit of the described technology.

Terms including ordinal numbers such as first, second, and the like, will be used only to describe various components, and are not interpreted as limiting these components. The terms are only used to differentiate one component from other components.

It is to be understood that when one component is referred to as being "connected" or "coupled" to another component, it may be connected or coupled directly to another component or be connected or coupled to another component with one or more other components intervening therebetween. On the other hand, it is to be understood that when one component is referred to as being "connected or coupled directly" to another component, it may be connected to or coupled to another component without any other component intervening therebetween.

Singular forms are to include plural forms unless the context clearly indicates otherwise.

It will be further understood that terms "comprises" or "have" used in the present specification specify the presence of stated features, numerals, steps, operations, components, parts, or a combination thereof, but do not preclude the presence or addition of one or more other features, numerals, steps, operations, components, parts, or a combination thereof. In this disclosure, the term "substantially" includes the meanings of completely, almost completely or to any significant degree under some applications and in accordance with those skilled in the art. Moreover, "formed on"

can also mean "formed over." The term "connected" can include an electrical connection.

An OLED display according to an exemplary embodiment may be applied to various electronic devices, such as digital TVs, desktop computers, digital signage, mobile phones, smart-phones, laptop computers, digital broadcasting terminals, personal digital assistants (PDAs), portable multimedia players (PMPs), navigation devices, slate computers, tablet computers, ultrabooks, wearable devices, for example, a watch type terminal (a smartwatch), a glass terminal (a smart glass), and a head mounted display (HMD).

FIG. 1 is a block diagram illustrating an OLED display according to an example embodiment. Depending on embodiments, certain elements may be removed from or additional elements may be added to the OLED display illustrated in FIG. 1. Furthermore, two or more elements may be combined into a single element, or a single element may be realized as multiple elements. This also applies to the remaining disclosed embodiments.

An OLED display includes a display unit 10, a scan driver 20, an initialization driver 22, a data driver 30, a light emission driver 40, a signal controller 50, and a power supply 60. The OLED display described in the present specification may include a larger or smaller number of components than those described above.

The display unit 10 includes a plurality of pixels PX that are connected to corresponding scan lines among a plurality of scan lines, corresponding initialization lines among a plurality of initialization lines, and corresponding data lines among a plurality of data lines. Each of the pixels PX displays an image according to a data signal transmitted thereto.

The pixels PX included in the display unit 10 are respectively connected to the scan lines, the initialization lines, a plurality of light emission control lines, and a plurality of data lines to be approximately arranged in a matrix form.

The scan lines substantially extend in a row direction to be substantially parallel to each other. The initialization lines and the light emission control lines substantially extend in a row direction to be substantially parallel to each other. The data lines substantially extend in a column direction to be substantially parallel to each other.

Each of the pixels PX of the display unit 10 receives an initialization voltage (VINT), a first driving voltage (ELVDD), and a second driving voltage (ELVSS) from a power supply 60.

A scan driver 20 is connected to the display unit 10 through the scan lines. The scan driver 20 generates a plurality of scan signals (GW[1]~GW[n]) according to a control signal (CONT2) and transmits the generated scan signals to corresponding scan lines among the scan lines.

The initialization driver 22 is connected to the display unit 10 through the plurality of initialization lines. The initialization driver 22 generates a plurality of initialization signals (GI) according to a control signal (CONT3) and then transmits the generated initialization signals to corresponding initialization lines among the initialization lines.

The control signals (CONT2, CONT3) are operating control signals of the scan driver 20 and the initialization driver 22 that are generated and transmitted by the signal controller 50. The control signals (CONT2, CONT3) may include a scan start signal and different types of clock signals. The scan start signal generates a first scan signal (GW[1]) for displaying an image of one frame. One of the clock signals is a synchronization signal for sequentially applying the scan signals (GW[1]~GW[n]) to the scan lines, and another of the clock signals is a synchronization signal for substantially simultaneously (or concurrently) applying the initialization signal (GI) and the reset signal (GB) to the initialization lines.

The data driver 30 is connected to each pixel PX through the data lines. The data driver 30 receives an image data signal (DATA) and transmits data signals (Data[1]~Data[m]) to corresponding data lines among the data lines according to a control signal (CONT1).

The control signal (CONT1) is an operating control signal of the data driver 30 that is generated and transmitted by the signal controller 50.

The data driver 30 selects a gray voltage according to the image data signal (DATA) and transmits the selected gray voltage as the data signals (Data[1]~Data[m]) to the data lines.

The data driver 30 samples and holds the image data signal (DATA) inputted according to the control signal (CONT1), and it respectively transmits the data signals (Data[1]~Data[m]) to the data lines. For example, the data driver 30 may apply the data signals (Data[1]~Data[m]) having a predetermined voltage range to the data lines depending on the scan signals (GW[1]~GW[n]) of a gate-on voltage.

The light emission driver 40 generates a plurality of light emission control signals (EM[1]~EM[n]) according to a light emission control signal (CONT4). The light emission driver 40 respectively transmits the light emission control signals (EM[1]~EM[n]) to a plurality of light emission control lines according to the control signal (CONT4).

The signal controller 50 receives an image signal (IS) inputted from the outside and an input control signal controlling the image signal (IS). The image signal (IS) may include luminance information that is differentiated based on gray in each pixel PX of the display unit 10, and the above-described frame data.

Meanwhile, an input control signal transmitted to the signal controller 50 may be a vertical synchronization signal (Vsync), a horizontal synchronization signal (Hsync), a main clock signal (CLK), or the like.

The signal controller 50 generates control signals (CONT1-CONT5) and the image data signal (DATA) according to the image signal (IS), the horizontal synchronization signal (Hsync), the vertical synchronization signal (Vsync), and the main clock signal (MCLK).

The signal controller 50 processes the image signal (IS) according to the operating conditions of the display unit 10 and the data driver 30 based on the inputted image signal (IS) and the input control signal. For example, the signal controller 50 may generate the image data signal (DATA) by applying image processes such as gamma correction, luminance compensation, and the like to the image signal (IS).

For example, the signal controller 50 generates the control signal (CONT1), which controls operation of the data driver 30, and transmits the generated control signal (CONT1) along with the image data signal (DATA) processed by the image processes to the data driver 30. Further, the signal controller 50 transmits the control signal (CONT2), which controls operation of the scan driver 20 to the scan driver 20. Further, the signal controller 50 transmits the control signal (CONT3), which controls operation of the initialization driver 22 to the initialization driver 22. Further, the signal controller 50 may transmit the light emission control signal (CONT4) to the light emission driver 40 to drive the light emission driver 40.

In addition, the signal controller 50 may control the power supply 60. The power supply 60 may supply an initialization voltage (VINT) that initializes a gate of the driving transistor and an anode of the OLED included in each pixel PX of the display unit 10 with a predetermined voltage, and supplies power voltages (ELVDD_V, ELVSS) for driving each pixel PX. For example, the signal controller 50 transmits the power control signal (CONT5) to the power supply 60 to drive the power supply 60. The power supply 60 is connected to power lines formed in the display panel 10.

Next, a pixel of an OLED display according to the present exemplary embodiment will be described in detail with respect to FIGS. 2 to 4.

Figure 2:
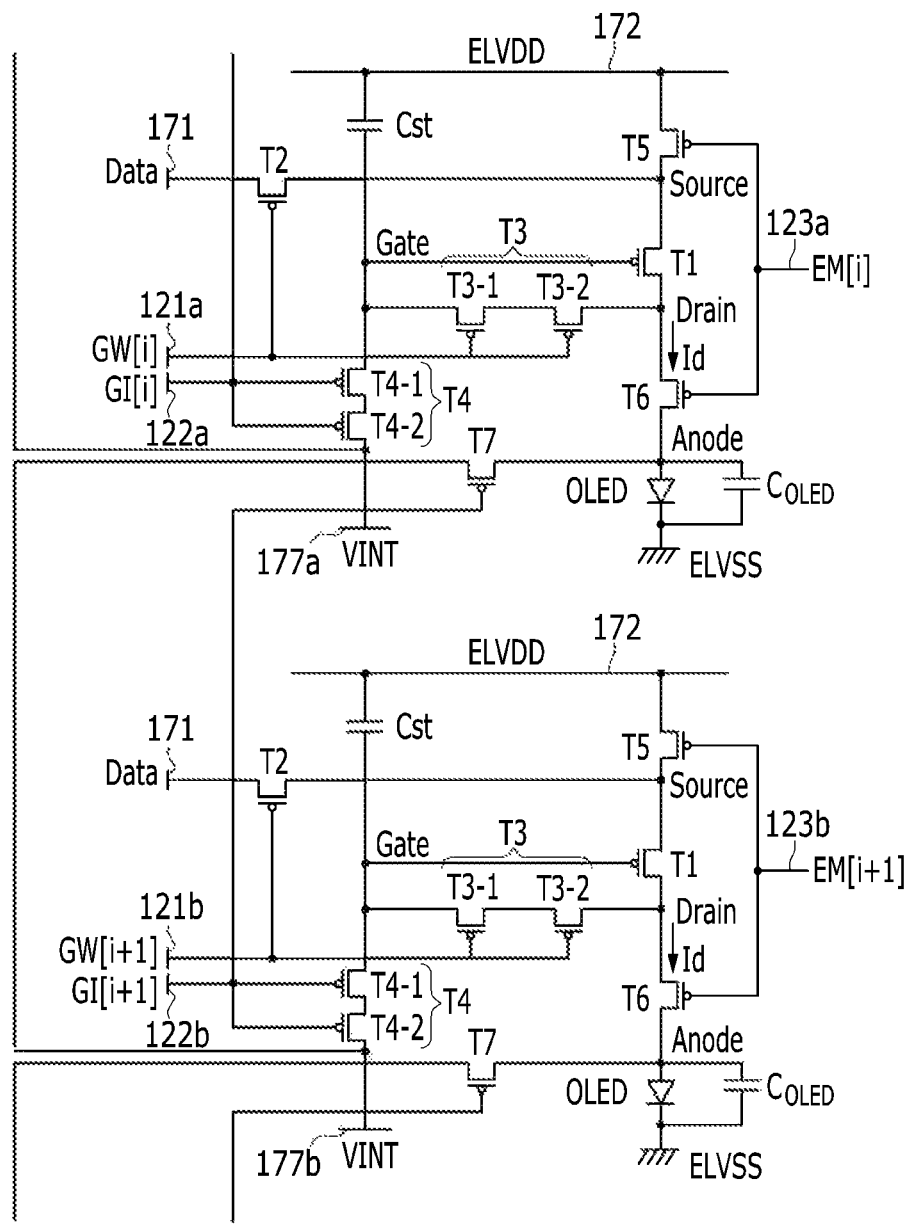
FIG. 2 is an equivalent circuit diagram illustrating a pixel of an OLED display according to the example embodiment.

FIG. 2 is an equivalent circuit diagram explaining a pixel of an OLED display according to the example embodiment.

As shown in FIG. 2, two adjacent pixels PX of the OLED display according to the exemplary embodiment include a plurality of signal lines (121*a*, 121*b*, 122*a*, 122*b*, 123*a*, 123*b*, 171, 172, 177*a*, 177*b*), a plurality of thin film transistors (T1, T2, T3, T4, T5, T6, T7) connected to the signal lines, a storage capacitor (Cst), and an OLED.

The thin film transistors include driving thin film transistors T1, switching thin film transistors T2, compensation thin film transistors T3, initialization thin film transistors T4, operation control thin film transistors T5, light emission control thin film transistors T6, and reset thin film transistors T7.

The signal lines include scan lines 121*a* and 121*b* transmitting the scan signals (GW), initialization lines 122*a* and 122*b* transmitting the initialization signals (GI) to the initialization thin film transistors T4 and the reset thin film transistors T7, light emission control lines 123*a* and 123*b* transmitting the light emission control signals (EM) to the operation control thin film transistors T5 and the light emission control thin film transistors T6, data lines 171 crossing the scan lines 121 and transmitting the data signals (Data), power lines 172 transmitting the first power voltages (ELVDD) and formed to be substantially parallel to the data lines 171, and initialization voltage lines 177*a* and 177*b* transmitting the initialization voltages (VINT) that initialize the driving thin film transistors T1 and the OLED.

In the pixel connected to an i-th row, the gate of the driving thin film transistor T1 is connected to one end of the storage capacitor Cst, and the source of the driving thin film transistor T1 is connected to the power lines 172 via the operation control thin film transistor T5. The drain of the driving thin film transistor T1 is electrically connected to the anode of the OLED via the light emission control thin film transistor T6. The driving thin film transistor T1 receives the data signal (DATA) according to a switching operation of the switching thin film transistor T2 to supply a driving current (Id) to the OLED.

The gate of the switching thin film transistor T2 is connected to the scan line 121*a*, and the source of the switching thin film transistor T2 is connected to the data line 171. The drain of the switching thin film transistor T2 is connected to the power line 172 via the operation control thin film transistor T5 while being connected to the source of the driving thin film transistor T1.

The switching thin film transistor T2 is turned on according to the scan signal (GW[i]) transmitted through the scan line 121 to transmit the data signal (DATA) transmitted to the data line 171 to the source of the driving thin film transistor T1, through the switching operation thereof.

The compensation thin film transistor T3 is formed as double-gate transistors T3-1 and T3-2 to prevent current leakage. The gates of the compensation thin film transistors T3-1 and T3-2 are connected to the scan lines 121*a*, and the source of the compensation thin film transistor T3-2 is connected to the anode of the OLED via the light emission control thin film transistor T6 while being connected to the drain of the driving thin film transistor T1. The drain of the compensation thin film transistor T3-1 is connected to one end of the storage capacitor Cst, the drain of the initialization thin film transistor T4, and the gate of the driving thin film transistor T1. Further, the drain of the compensation thin film transistor T3-2 and the source of the compensation thin film transistor T3-1 are connected to each other.

The compensation thin film transistor T3 is turned on according to the scan signal (GW[i]) transmitted through the scan lines 121*a* to connect the gate and the drain of the driving thin film transistor T1 to each other, such that the driving thin film transistor T1 may be operated as a diode.

The initialization thin film transistor T4 is formed as double-gate transistors T4-1 and T4-2, thereby preventing current leakage. The gate of the initialization thin film transistor T4-1 is connected to an initialization line 122*a*, and the drain of the initialization thin film transistor T4-1 is connected to the source of the initialization thin film transistor T4-2. The source of the initialization thin film transistor T4-1 is connected to one end of the storage capacitor Cst, the drain of the compensation thin film transistor T3-1, and the gate of the driving thin film transistor T1.

The gate of the initialization thin film transistor T4-2 is connected to an initialization line 122*a*, and the drain of the initialization thin film transistor T4-2 is connected to the initialization voltage line 177*a*. The source of the initialization thin film transistor T4-2 is connected to the drain of the initialization thin film transistor T4-1.

The initialization thin film transistor T4 is turned on according to the initialization signal (GI) transmitted through the initialization line 122*a* to transmit the initialization voltage (VINT) to the gate of the driving thin film transistor T1 such that a voltage of the gate of the driving thin film transistor T1 may be initialized.

The gate of the operation control thin film transistor T5 is connected to the light emission control line 123*a*, and the source of the operation control thin film transistor T5 is connected to the power line 172. The drain of the operation control thin film transistor T5 is connected to the source of the driving thin film transistor T1 and the drain of the switching thin film transistor T2.

The gate of the light emission control thin film transistor T6 is connected to the light emission control line 123*a*, and the source of the light emission control thin film transistor T6 is connected to the drain of the driving thin film transistor T1 and the source of the compensation thin film transistor T3. The drain of the light emission control thin film transistor T6 is electrically connected to the anode of the OLED and the source of the reset thin film transistor T7.

The operation control thin film transistor T5 and the light emission control thin film transistor T6 are substantially simultaneously (or concurrently) turned on according to the light emission control signal (EM) transmitted through the light emission control line 123, and thus the first power voltage (ELVDD_V) is transmitted to the OLED for the driving current (Id) to flow through the OLED.

The gate of the reset thin film transistor T7 is connected to an i+1-th row initialization line 122*b*, and the drain of the reset thin film transistor T7 is connected to an i+1-the row initialization voltage line 177*b*. The source of the reset thin film transistor T7 is electrically connected to the anode of the OLED and the drain of the light emission control thin film transistor T6.

The reset thin film transistors T7 are substantially simultaneously (or concurrently) turned on according to the initialization signal (GI[i+1]) transmitted through the i+1-th initialization line 122b to initialize an anode voltage of the OLED with the initialization voltage (VINT).

The other end of the storage capacitor Cst is connected to the power line 172, and the cathode of the organic light-emitting diode is connected to the common voltage (ELVSS). Accordingly, the OLED receives the driving current (Id) from the driving thin film transistor T1 and then emits light to display an image.

A structure of the pixel of the organic light-emitting diode display shown in FIG. 2 will be described in detail with reference to FIGS. 3 and 4, along with FIG. 2.

Figure 3:
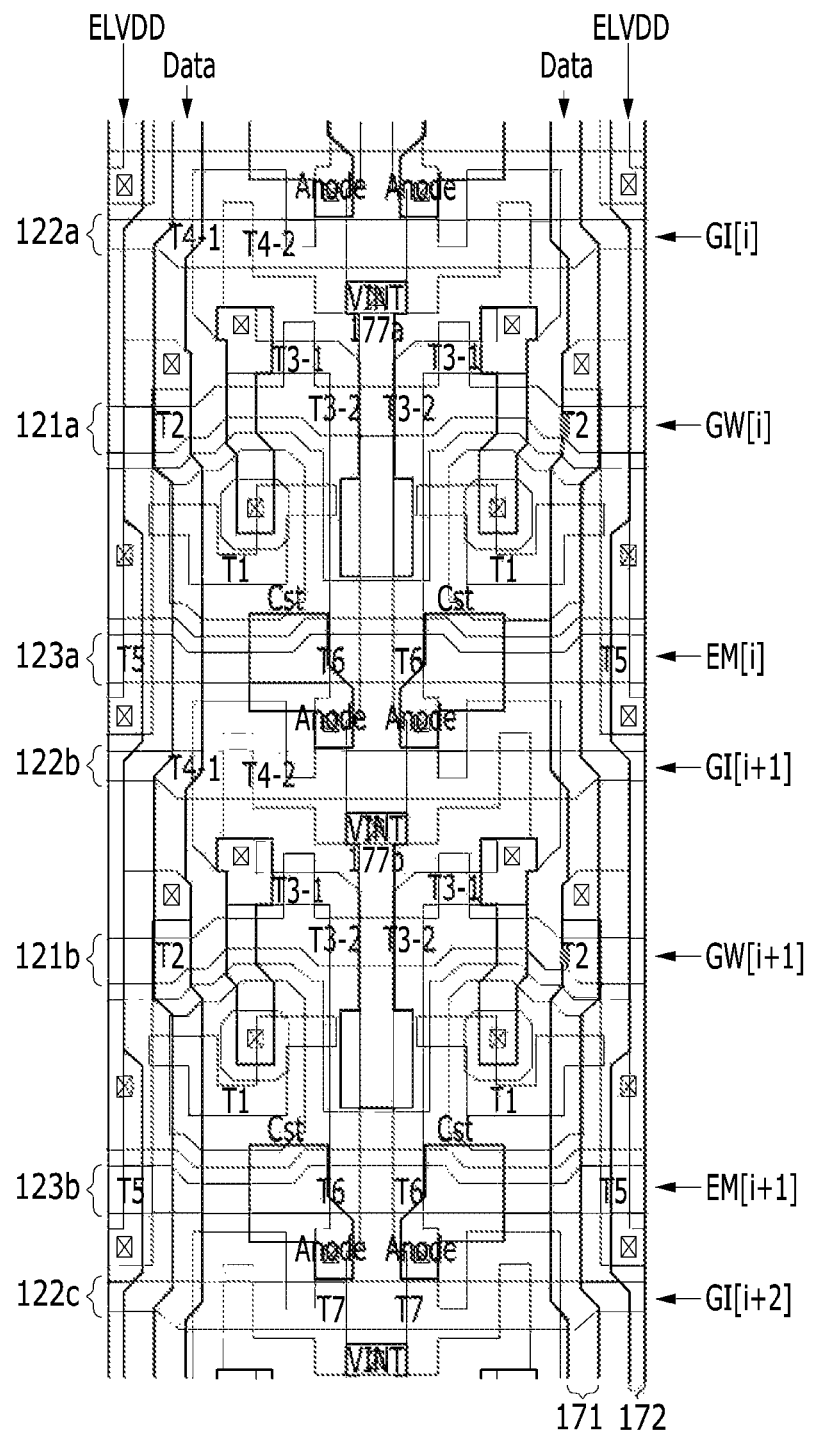
FIG. 3 is a schematic diagram illustrating positions of a plurality of thin film transistors and capacitors of an OLED display according to the example embodiment.

FIG. 3 is a schematic diagram illustrating positions of a plurality of thin film transistors and capacitors of an organic light-emitting diode display according to the example embodiment. FIG. 4 is a detailed layout view of the signal lines and the transistors of an organic light-emitting diode display according to the example embodiment.

Figure 4:
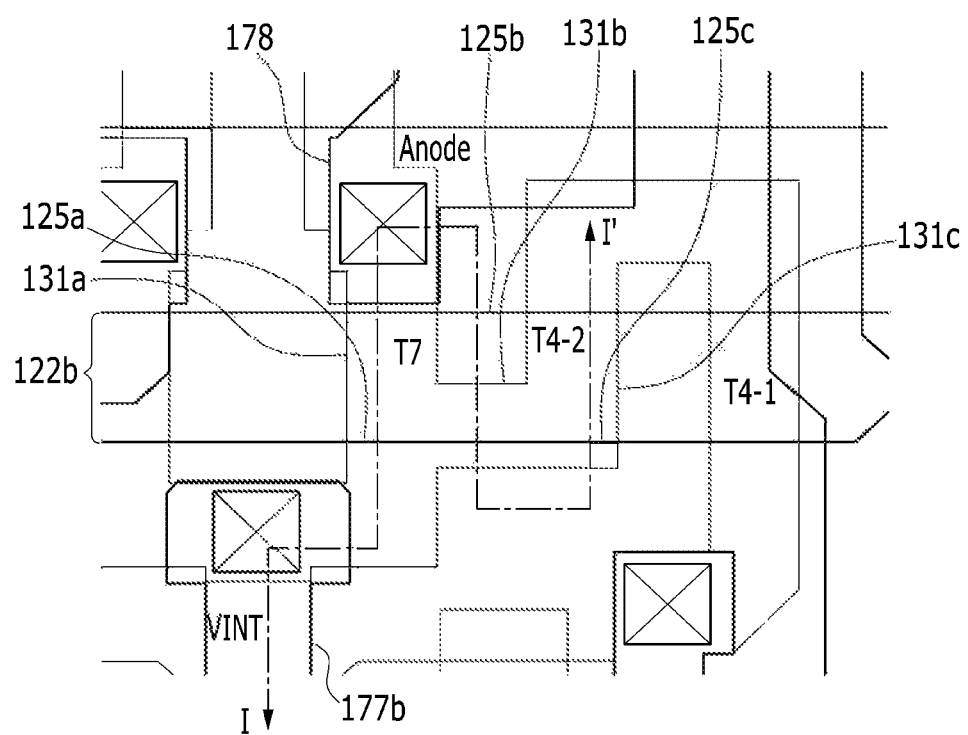
FIG. 4 is a layout view of signal lines and transistors of an OLED display according to the example embodiment.

As shown in FIGS. 3 and 4, the pixels of the OLED display according to the exemplary embodiment include the scan lines 121a and 121b, the initialization lines 122a, 122b, and 122c, the light emission control lines 123a and 123b, and the power line 172, which respectively apply the scan signals (GW[i], GW[i+1]), the initialization signals (GI[i], GI[i+1], GI[i+2]), and the light emission control signals (EM[i], EM[i+1]), and which are formed in a row direction.

Further, the pixels cross all of the scan lines 121a and 121b, the initialization lines 122a, 122b, and 122c, the light emission control lines 123a and 123b, and the power line 172, and they include the data line 171 and the power line 172 that respectively apply the data signal (DATA) and the first power voltage (ELVDD) thereto.

Further, the driving thin film transistor T1, the switching thin film transistor T2, the compensation thin film transistor T3, the initialization thin film transistor T4, the operation control thin film transistor T5, the light emission control thin film transistor T6, the reset thin film transistor T7, and the storage capacitor Cst are formed in each of the pixels.

The transistors (T1-T7) may be at least one of an amorphous silicon thin film transistor (amorphous-Si TFT), a low temperature poly-silicon (LTPS) thin film transistor, or an oxide thin film transistor (Oxide TFT). The oxide thin film transistor (Oxide TFT) may include an oxide semiconductor layer formed of amorphous indium-galium-zinc-oxide (IGZO), zinc-oxide (ZnO), titanium oxide (TiO), or the like.

The driving thin film transistor T1, the switching thin film transistor T2, the compensation thin film transistor T3, the initialization thin film transistor T4, the operation control thin film transistor T5, the light emission control thin film transistor T6, and the reset thin film transistor T7 are formed along the semiconductor layer, and the semiconductor layer is formed to be bent into various shapes.

For example, each gate of the initialization thin film transistor T4 and the reset thin film transistor T7 is formed of the initialization lines (GI[i], GI[i+1], GI[i+2]). Further, the semiconductor layer of the reset thin film transistor T7 of the i-th row pixel and the semiconductor layer of the initialization thin film transistor T4-2 of the i+1-th row pixel are connected to the initialization voltage line 177b.

Referring to FIG. 4 in this regard, the semiconductor layer of the reset thin film transistor T7 of the i-th row pixel and the semiconductor layer of the initialization thin film transistor T4-2 of the i+1-th row pixel include a first semiconductor area 131a and a third semiconductor area 131c formed in a column direction, and a second semiconductor area 131b formed in a row direction.

The second semiconductor area 131b formed in the row direction is disposed between the first semiconductor area 131a and the third semiconductor area 131c formed in the column direction.

The first semiconductor area 131a, the third semiconductor area 131c, and the second semiconductor area 131b overlap the initialization line 122b formed to extend in the row direction. The overall shape of the first semiconductor area 131a, the second semiconductor area 131b, and the third semiconductor area 131c may be a U-shape.

One portion of the first semiconductor area 131a may overlap the initialization line 122b and, in some embodiments, portions other than the one portion may not overlap the initialization line 122b. The first semiconductor area 131a is connected to an anode of the i-th row pixel.

One portion of the second semiconductor area 131b may overlap the initialization line 122b and, in some embodiments, portions other than the one portion may not overlap the initialization line 122b.

One portion of the third semiconductor area 131c may overlap the initialization line 122b and, in some embodiments, portions other than the one portion may not overlap the initialization line 122b.

A stacked layer structure of the organic light-emitting diode display will now be described with reference to FIG. 5.

Figure 5:
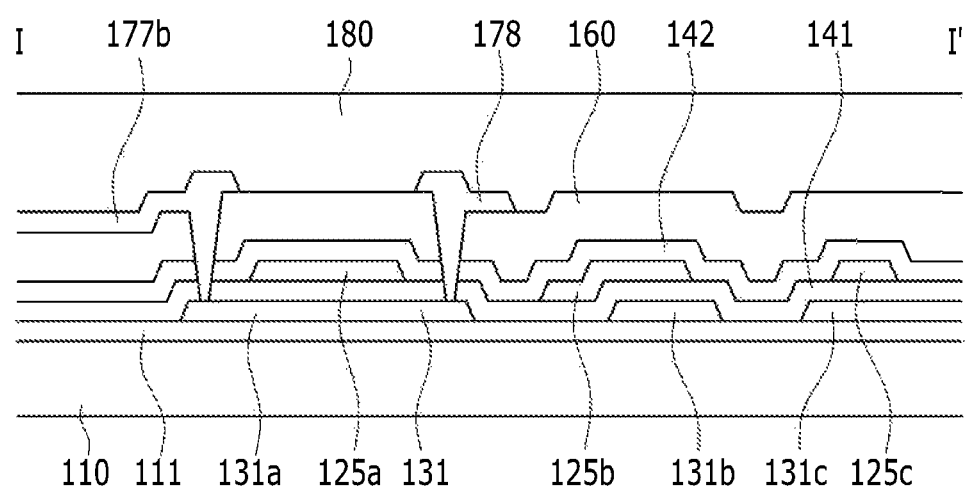
FIG. 5 is a cross-sectional view of the OLED display of FIG. 4 taken along line I-I'.

FIG. 5 is a cross-sectional view of the organic light-emitting diode display of FIG. 4 taken along line I-I'.

A buffer layer 111 is formed on a substrate 110, and the substrate 110 is formed as an insulation substrate that is made of glass, quartz, ceramic, plastic, or the like.

The first semiconductor area 131a, the second semiconductor area 131b, and the third semiconductor area 131c are formed on the buffer layer 111.

A first gate insulating layer 141 that is formed of a silicon nitride (SiNx), a silicon oxide (SiO2), or the like is formed on the first semiconductor area 131a, the second semiconductor area 131b, and the third semiconductor area 131c.

The initialization line 122b including gate electrodes 125a, 125b, and 125c is formed on the first gate insulating layer 141.

The gate electrode 125a overlaps the first semiconductor area 131a. Further, the gate electrode 125b partially overlaps the second semiconductor area 131b. The second semiconductor area 131b partially overlaps the gate electrode 125b. The gate electrode 125c overlaps the third semiconductor area 131c.

The initialization line 122b and the first gate insulating layer 141 are covered by the second gate insulating layer 142. The second gate insulating layer 142 is formed of a silicon nitride (SiNx), a silicon oxide (SiO2), or the like.

An interlayer insulating layer 160 is formed on the second gate insulating layer 142. The first gate insulating layer 141, the second gate insulating layer 142, and the interlayer insulating layer 160 have contact holes 163a and 163b exposing the first semiconductor area 131a. Similar to the first gate insulating layer 141 and the second gate insulating layer 142, the interlayer insulating layer 160 may be formed of a ceramic-based material such as a silicon nitride (SiNx), a silicon oxide (SiO2), or the like.

Further, the initialization voltage line 177b and the anode 178 are respectively connected to the source area and the drain area of the first semiconductor area 131a through the contact holes 163a and 163b respectively formed on the interlayer insulating layer 160, the first gate insulating layer 141, and second gate insulating layer 142.

A passivation layer 180 is formed on the interlayer insulating layer 160 to cover the initialization voltage line 177b and the anode 178.

In the exemplary embodiments, the semiconductor layer of the reset thin film transistor T7 and the semiconductor layer of the initialization thin film transistor T4-2 include the first semiconductor area 131a, the second semiconductor area 131b, and the third semiconductor area 131c. In some embodiments, the second semiconductor area 131b connecting the first semiconductor area 131a and the third semiconductor area 131c overlaps the initialization line 122b, thereby widening the area of the elements included in the pixel, particularly the area of the storage capacitor Cst, so that the organic light-emitting diode display may abundantly represent the gray therein.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light-emitting diode (OLED) display, comprising:
    a substrate;
    a plurality of signal lines formed over the substrate; and
    a plurality of pixels formed over the substrate in a matrix form and electrically connected to corresponding signal lines among the signal lines,
    wherein the signal lines include:
        a plurality of scan lines formed over the substrate and configured to transmit a scan signal;
        a plurality of initialization lines formed over the substrate and configured to transmit an initialization signal; and
        a plurality of data lines crossing the scan lines and configured to transmit a data signal,
    wherein an n-th row pixel includes:
        a switching thin film transistor (TFT) electrically connected to an n-th row scan line and a corresponding data line among the data lines;
        a driving TFT electrically connected to a drain of the switching TFT;
        an OLED electrically connected to a drain of the driving TFT;
        an initialization TFT configured to be turned on based on an initialization signal transmitted via an n-th row initialization line so as to apply an initialization voltage to a gate of the driving TFT,
    wherein the substrate includes first to third semiconductor areas located in the n-th row,
    wherein an (n+1)-th row initialization line overlaps the second semiconductor area in the depth dimension of the OLED display, wherein the first and third semiconductor areas extend in a first direction, and wherein the second semiconductor area extends in a second direction crossing the first direction.

2. The OLED display of claim 1, wherein the n-th row pixel further includes a reset TFT configured to be turned on based on the initialization signal transmitted via the n+1-th row initialization line so as to apply the initialization voltage to the OLED.

3. The OLED display of claim 2, wherein the (n+1)-th row initialization line includes a gate electrode of the reset TFT included in the n-th row pixel and a gate electrode of the initialization TFT included in an (n+1)-th row pixel.

4. The OLED display of claim 3, wherein the reset TFT included in the n-th row pixel and the initialization TFT included in the (n+1)-th row pixel include the first to third semiconductor areas.

5. The OLED display of claim 4, wherein each of the first to third semiconductor areas has a substantially U-shape.

6. The OLED display of claim 4, wherein the first semiconductor area is electrically connected to an anode electrode of the OLED and an initialization voltage line configured to supply the initialization voltage via the contact hole.

7. The OLED display of claim 4, wherein the second semiconductor area partially overlaps the (n+1)-th row initialization line.

8. The OLED display of claim 1, wherein the first to third semiconductor areas are integrally formed.

9. The OLED display of claim 1, wherein the first to third semiconductor areas are formed on the same layer.

10. An organic light-emitting diode (OLED) display, comprising:
    a substrate;
    a plurality of pixels formed over the substrate in a matrix form, wherein the pixels include an n-th row of pixels and an (n+1)-th row of pixels, and wherein the n-th row of pixels includes first to third semiconductor areas; and
    a plurality of initialization lines formed over the substrate and configured to transmit an initialization signal to the pixels,
    wherein each of the n-th and (n+1)-th rows includes a reset transistor, wherein the initialization line of the (n+1)-th row is electrically connected to a gate electrode of the reset transistor of the n-th row,
    wherein the (n+1)-th row initialization line overlaps the second semiconductor area in the depth dimension of the OLED display,
    wherein the first and third semiconductor areas extend in a first direction, and wherein the second semiconductor area extends in a second direction crossing the first direction.

11. The OLED display of claim 10, further comprising an initialization transistor in the n-th and (n+1)-th rows and having a double-gate structure, wherein the initialization transistor includes two gate electrodes electrically connected to the corresponding initialization line.

12. The OLED display of claim 11, wherein the first to third semiconductor areas are formed on the same layer.

13. The OLED display of claim 12, wherein at least a portion of the second semiconductor area is placed between the first and third semiconductor areas.

14. The OLED display of claim 13, wherein the first and second directions are substantially perpendicular to each other.

* * * * *